(12) United States Patent
Hanada et al.

(10) Patent No.: US 11,824,063 B2
(45) Date of Patent: Nov. 21, 2023

(54) METHOD FOR PRODUCING SEMICONDUCTOR DEVICE

(71) Applicant: Japan Display Inc., Tokyo (JP)

(72) Inventors: Akihiro Hanada, Tokyo (JP); Toshihide Jinnai, Tokyo (JP)

(73) Assignee: Japan Display Inc., Tokyo (JP)

(*) Notice: Subject to any disclaimer, the term of this patent is extended or adjusted under 35 U.S.C. 154(b) by 410 days.

(21) Appl. No.: 17/148,653

(22) Filed: Jan. 14, 2021

(65) Prior Publication Data
US 2021/0134848 A1 May 6, 2021

Related U.S. Application Data

(63) Continuation of application No. PCT/JP2019/025099, filed on Jun. 25, 2019.

(30) Foreign Application Priority Data

Jul. 25, 2018 (JP) ................. 2018-139126

(51) Int. Cl.
*H01L 27/12* (2006.01)
*H01L 29/66* (2006.01)
*H01L 29/786* (2006.01)

(52) U.S. Cl.
CPC ...... *H01L 27/1229* (2013.01); *H01L 27/1225* (2013.01); *H01L 29/66969* (2013.01); *H01L 29/7869* (2013.01)

(58) Field of Classification Search
CPC ............. H01L 27/1229; H01L 27/1225; H01L 27/1211; H01L 27/1237; H01L 29/66969;
(Continued)

(56) References Cited

U.S. PATENT DOCUMENTS 10,115,740 B2 * 10/2018 Hanada ............ H02J 13/00016
11,024,725 B2 * 6/2021 Yamazaki ........... H01L 29/7869
(Continued)

FOREIGN PATENT DOCUMENTS

JP 2017-28288 A 2/2017
JP 2017-76787 A 4/2017
(Continued)

OTHER PUBLICATIONS

International Search Report dated Sep. 17, 2019 in PCT/JP2019/025099 filed Jun. 25, 2019, citing documents AA-AD and AO-AR therein, 2 pages.

*Primary Examiner* — Nikolay K Yushin
(74) *Attorney, Agent, or Firm* — Maier & Maier, PLLC

(57) ABSTRACT

An object of the present invention is to provide a technology using which, in a thin film transistor using oxide semiconductor, the resistance of a channel region of the oxide semiconductor is made high, and at the same time the resistances of a source region and a drain region of the oxide semiconductor are made low. There is provided a semiconductor device including: a thin film transistor including oxide semiconductor, the oxide semiconductor including a channel region, a drain region, and a source region; a gate insulating film formed on the channel region; an aluminum oxide film formed on the gate insulating film; and a gate electrode formed on the aluminum oxide film, wherein the aluminum oxide film has a region that covers neither the drain region nor the source region in a plane view.

2 Claims, 16 Drawing Sheets

(58) Field of Classification Search
CPC ............. H01L 29/7869; H01L 29/0847; H01L 29/66446; H01L 21/8234; H01L 21/02178; H01L 21/42; H01L 27/088; H01L 29/49; G02F 1/1368; G02F 1/136227; G02F 1/13685; G09F 9/30; G09F 9/302; G09F 9/33
See application file for complete search history.

(56) References Cited

U.S. PATENT DOCUMENTS

| | | |
|---|---|---|
| 2017/0025544 A1 | 1/2017 | Yamazaki et al. |
| 2017/0084641 A1* | 3/2017 | Lin .................... H01L 27/1225 |
| 2017/0104089 A1 | 4/2017 | Koezuka et al. |
| 2017/0104090 A1 | 4/2017 | Koezuka et al. |
| 2017/0162715 A1 | 6/2017 | Okada et al. |
| 2017/0207245 A1* | 7/2017 | Hanada ................. H04L 41/069 |
| 2018/0122835 A1 | 5/2018 | Watakabe et al. |

FOREIGN PATENT DOCUMENTS

| | | |
|---|---|---|
| JP | 2017-76788 A | 4/2017 |
| JP | 2017-107913 A | 6/2017 |
| JP | 2018-74076 A | 5/2018 |

* cited by examiner

METHOD FOR PRODUCING SEMICONDUCTOR DEVICE

CROSS-REFERENCE TO RELATED APPLICATION

This application is a Bypass Continuation Application of PCT international Application No. PCT/JP2019/025099 filed on Jun. 25, 2019, which claims priority to Japanese Patent Application No. 2018-139126, filed on Jul. 25, 2018, the entire contents of which are incorporated herein by reference.

BACKGROUND OF THE INVENTION

The present invention relates to semiconductor devices, and especially relates to a semiconductor device such as a display device including thin film transistors using oxide semiconductor.

A liquid crystal display device has a configuration in which a TFT (thin film transistor) substrate including pixels each of which includes a pixel electrode, a thin film transistor (TFT), and the like, and a facing substrate disposed facing the TFT substrate, and liquid crystal sandwiched between the TFT substrate and the facing substrate. In addition, an image is formed by controlling the light transmittance caused by liquid crystal molecules for each pixel.

Because the leakage current of a TFT using oxide semiconductor is small, the THT is suitable for being used as a switching THT in a pixel region.

It is necessary for the leakage current of a switching TFT in a pixel region to be small. On the other hand, the ON current of the switching TFT in a pixel region is required to be large. In other words, it is necessary for an TFT using oxide semiconductor to retain a sufficiently large resistance in its channel region and to have sufficiently small resistances in its source region and drain region.

Japanese Unexamined Patent Application Publication No. 2017-107913 proposes a method of manufacturing a thin film transistor that says, "A first island shaped insulating layer including oxygen is formed on an insulating substrate, oxygen ions are implanted into the first insulating layer, an oxide semiconductor layer is formed on the insulating substrate and the first insulating layer, oxygen is supplied to a region on the first insulating layer of the semiconductor layer from the first insulating layer through thermal treatment, and a channel region is formed."

SUMMARY OF THE INVENTION

The inventors examined a method of supplying oxygen to the channel region of oxide semiconductor by forming a gate insulating film on the oxide semiconductor, forming an aluminum oxide film on the gate insulating film in such a way that the gate insulating film and the aluminum oxide film are laminated in this order, and supplying oxygen to the entire surface of the gate insulating film in the production of a TFT using oxide semiconductor. It has become clear, however, that it is difficult to make the resistances of the source and drain regions of the oxide semiconductor that are adjacent to the channel region sufficiently small because oxygen is supplied to the source and drain regions too.

The present invention is achieved for proposing measures taken against an phenomenon in which a means (an aluminum oxide film) for supplying oxygen to the channel region of oxide semiconductor exerts an influence on the drain region and the source region of the oxide semiconductor, so that the resistances of the source region and the drain region become large and the ON current of the relevant TFT become small.

An object of the present invention is to provide a technology using which the resistance of the channel region of oxide semiconductor is made high and at the same time the resistances of the source region and drain region are made low in a thin film transistor using the oxide semiconductor.

Problems other than the above and new features will be explicitly shown by the descriptions of this specification and the accompanying drawings.

The outline of a typical aspect of the present invention will be briefly explained as follows.

According to an aspect of the present embodiment, provided is a semiconductor device including: a thin film transistor including oxide semiconductor, the oxide semiconductor including a channel region, a drain region, and a source region; a gate insulating film formed on the channel region; an aluminum oxide formed on the gate insulating film; and a gate electrode formed on the aluminum oxide film, in which the aluminum oxide film has a region that covers neither the drain region nor the source region in a plane view.

Furthermore, according to another aspect of the present embodiment, there is provided a semiconductor device including: a substrate; a first thin film transistor that is formed on the substrate and that includes polycrystalline silicon; a second thin film transistor that is formed on the substrate and that includes oxide semiconductor, in which the oxide semiconductor includes a channel region, a drain region, and a source region; a gate insulating film formed on the channel region; an aluminum oxide film formed on the gate insulating film; and a gate electrode formed on the aluminum oxide film.

In addition, according to another aspect of the present embodiment, there is provided a method of manufacturing a semiconductor device including a thin film transistor having a semiconductor layer of oxide semiconductor with a channel region, a drain region, and a source region, the method including the steps of: forming the semiconductor layer on a substrate; forming a gate insulating film so that the gate insulating film covers the semiconductor layer; forming a block layer having an opening over the channel region of the semiconductor layer on the gate insulating film; and forming an aluminum oxide film on the block layer and on a portion of the gate insulating film exposed from the opening and supplying oxygen through the opening to the channel region of the semiconductor layer as well.

DETAILED DESCRIPTION OF THE PREFERRED EMBODIMENTS

Figure 1:
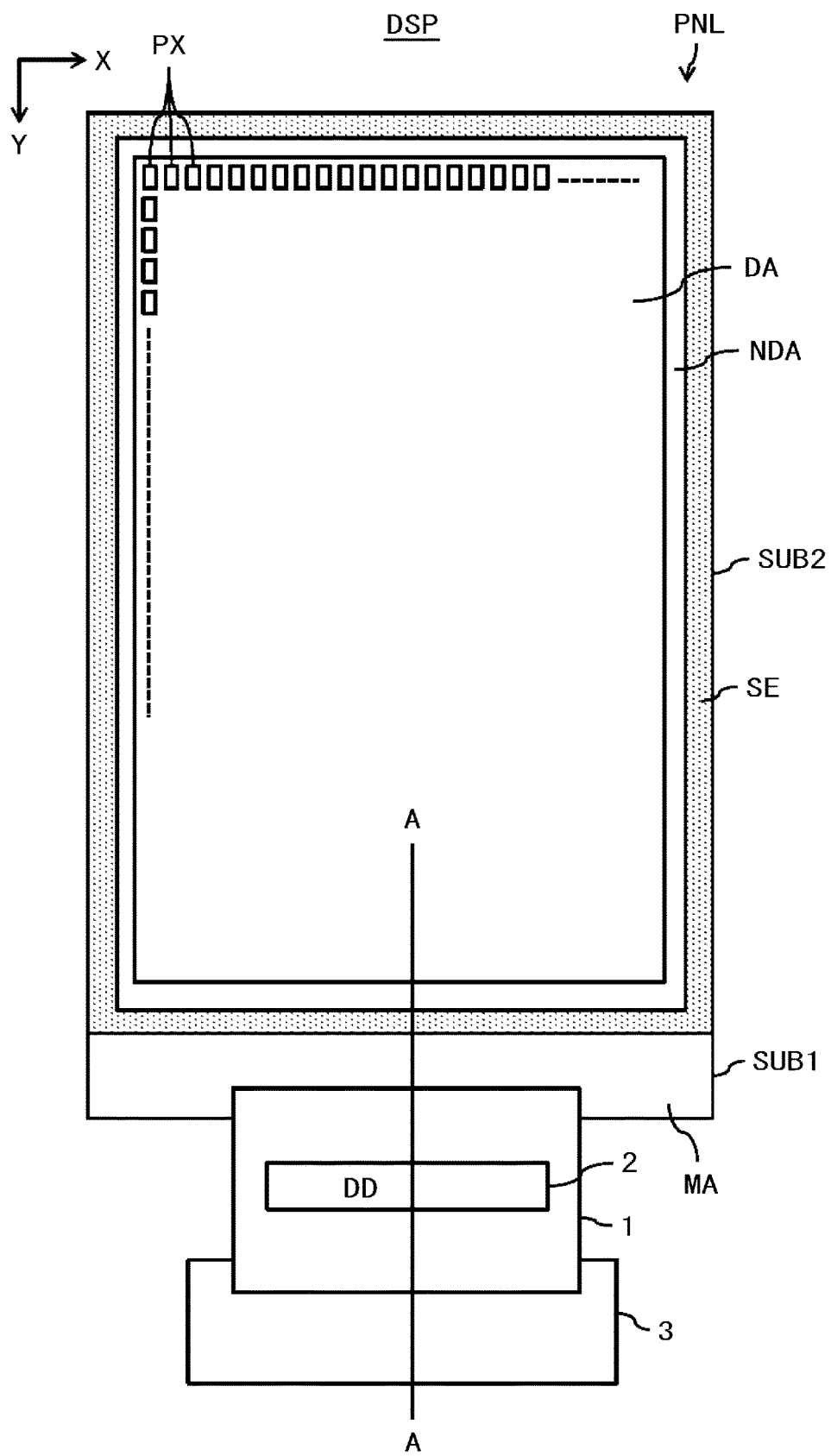
FIG. 1 is a plan view showing the exterior appearance of a display device DSP according to an embodiment.

Hereinafter an embodiment of the present invention will be explained with reference to the accompanying drawings.

Here, the following disclosure is only an example, and it goes without saying that various modifications that may be made accordingly by those skilled in the art without deviating from the gist of the present invention fall within the scope of the present invention. Furthermore, there are some cases where, in the accompanying drawings, the widths, thicknesses, shapes, and the like of respective portions of the actual embodiment are schematically depicted differently from what they really are, but these depictions are only examples, so that the interpretation of the present invention is not limited to these depictions. In addition, in this specification and the accompanying drawings, there are some cases where the same components as components that have appeared in already-described drawings are given the same reference signs, and detailed explanations about them may be omitted accordingly.

In the present embodiment, as an example of a display device, a liquid crystal display device will be disclosed. This liquid crystal display device can be used for various devices such as a smart phone, a tablet terminal, a cellular phone terminal, a personal computer, a TV receiver, an in-vehicle device, and a game machine.

Here, in the scope of the present specification and the appended claims, a term such as "upper", "lower", or the like represents the relative positional relation of a targeted structure to another structure. To put it concretely, when the side of the targeted structure is looked at, a direction from a first substrate (an array substrate) to a second substrate (a facing substrate) is defined as an "upper" direction and an opposite direction thereto is defined as a "lower" direction.

Furthermore, terms such as "inner" and "outer" represent relative positional relations of two portions on the basis of a display area. In other words, an "inner" portion indicates one portion nearer to the display area than the other portion, and an "outer" portion indicates one portion farther from the display area than the other portion. Here, the definitions of the terms "inner" and "outer" should be made under the condition that the relevant liquid crystal display device is not folded into two.

A "display device" indicates a general display device that displays videos using a display panel. The "display panel" indicates a structure that displays videos using an electrooptic layer. For example, a term "display panel" indicates a display cell including an electrooptic layer in some cases, or indicates a structure in which other optical materials (for example, a polarizing material, a backlight, a touch panel, and the like) are mounted in other cases instead of the display cell. Here, the "electrooptic layer" can include a liquid crystal layer, an electrochromic (EC) layer, and the like as long as any technological problem does not occur. Therefore, just because a liquid crystal panel including a liquid crystal layer will be explained as an example of a display panel in the following descriptions of the present embodiment does not mean that the present embodiment is not applicable to a display panel including any of the abovementioned electrooptic layer other than the liquid crystal layer.

Entire Configuration Example of Display Device

Figure 2:
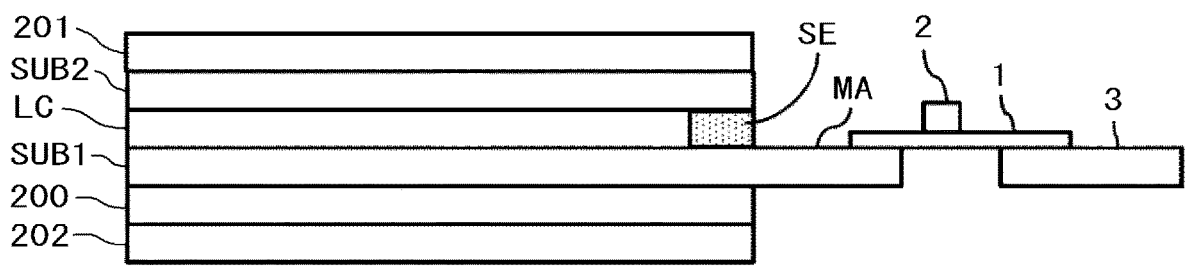
FIG. 2 is a cross-sectional view taken along the line A-A of FIG. 1.

FIG. 1 is a plan view of a display device to which the present application is applied. FIG. 2 is a cross-sectional view taken along the line A-A of FIG. 1.

In FIG. 1 and FIG. 2, the display device DSP includes: a display panel PNL; a flexible printed circuit board 1; an IC chip 2; and a circuit board 3. The display panel PNL is a liquid crystal display panel and includes: a first substrate (also referred to as a TFT substrate or an array substrate) SUB1; a second substrate (also referred to as a facing substrate) SUB2; a liquid crystal layer LC; and a seal member SE.

The display pane PNL includes a display portion (display area) DA for displaying images and a frame shaped non-display portion (non-display area) NDA surrounding the outer circumference of the display portion DA. The first substrate SUB1 includes a mounting unit MA extending further in the second direction Y than the second substrate SUB2. The seal SE is located in the non-display portion NDA and the seal SE bonds the first substrate SUB1 and the second substrate SUB2 together, and at the same time, the seal SE seals the liquid crystal layer LC.

As shown in FIG. 2, a lower polarizing plate 200 is pasted to the lower surface of the first substrate SUB1, and a higher polarizing plate 201 is pasted to the upper surface of the second substrate SUB2. A combination of the first substrate SUB1, the second substrate SUB2, the lower polarizing plate 200, the upper polarizing plate 201, and the liquid crystal layer LC will be referred to as the display panel PNL. Because the display panel PNL does not emit light by itself, a backlight 202 is disposed under (on the rear side of) the display panel PNL.

Plural external terminals are formed on the mounting unit MA. The flexible printed circuit board 1 is connected to the plural external terminals on the mounting unit MA. The IC chip 2 for supplying audio signals and the like is mounted on the flexible printed circuit board 1. The circuit board 3 for supplying signals and electric power from external to the IC chip 2 and the display device DSP is connected to the flexible printed circuit board 1. Here, it is conceivable that the IC chip 2 is mounted on the mounting unit MA. The IC chip 2 embeds a display driver DD that outputs signals necessary for image display in a display mode in which images are displayed.

As shown in FIG. 1, plural pixels PX are formed in the display area DA in a matrix shape, and each pixel PX includes a thin film transistor (TFT) as a switching element. A drive circuit for controlling and driving scanning lines, video signal lines (hereinafter referred to as signal lines), and the like is formed in the non-display area NDA. The drive circuit includes thin film transistors (TFTs).

A TFT used as a switching element for a pixel PX is required to have a small leakage current. By using oxide semiconductor to form a TFT, the leakage current of the TFT can be made small. Hereinafter oxide semiconductor will be referred to as OS (Oxide Semiconductor). There are various kinds of OS such as IGZO (Indium Gallium Zinc Oxide), ITZO (Indium Tin Zinc Oxide), ZnON (Zinc Oxide Nitride), and IGO (Indium Gallium Oxide). Hereinafter OS is used in the following explanations as a representative of the above oxide semiconductors. Because the mobilities of the carriers of OS are small, it is difficult to form a drive circuit embedded in the display device DSP with TFTs using OS. Hereinafter OS is used to stand for a TFT made using OS in some cases.

On the other hand, LTPS (Low Temperature Poly-Si) has high mobilities, so that it is suitable to be used for the TFTs included in the drive circuit. Because LTPS is often used as polycrystalline silicon or polycrystal silicon (Poly-Si) in a liquid crystal display device, hereinafter Poly-Si will also be referred to as LTPS. The mobilities of a TFT formed of LTPS is large, so the drive circuit can be formed of thin film transistors (TFTs) using LTPS. Hereinafter LTPS is used to stand for a TFT using LTPS in some cases.

That is to say, it is rational that, because the leakage current of a thin film transistor (TFT) used for the pixel PX needs to be small, oxide semiconductor (OS) is used, and it is also rational that, because the mobilities of a thin film transistor (TFT) used for the drive circuit need to be large, LTPS is used.

However, there are some cases where the mobilities of amorphous silicon (a-Si) and OS are sufficient for the designs of some kinds of application products, so that the configuration proposed by the present invention is also effective in designing a drive circuit using a-Si or OS.

The display panel PNL according to the present embodiment can be any of a transmissive type panel having a transmissive display function that displays images by selectively transmitting light emitted from the rear side of the first substrate SUB1, a reflective type panel having a reflective display function that displays images by selectively reflecting light emitted from the front side of the second substrate SUB2, and a semi-transmissive type panel having both transmissive display function and reflective display function.

In addition, although the detailed configuration of the display pane PNL is not explained here, it is conceivable that the display panel PNL includes a configuration compatible with any of a display mode using a longitudinal electric field along the normal line of a main substrate surface, a display mode using an oblique electric field that is oblique to the main substrate surface, and a display mode using an adequate combination of the abovementioned longitudinal and oblique electric fields. Here, the main substrate surface is a surface parallel with the XY plan defined by the first direction X and the second direction Y.

Circuit Configuration Example of Display Device

Figure 3:
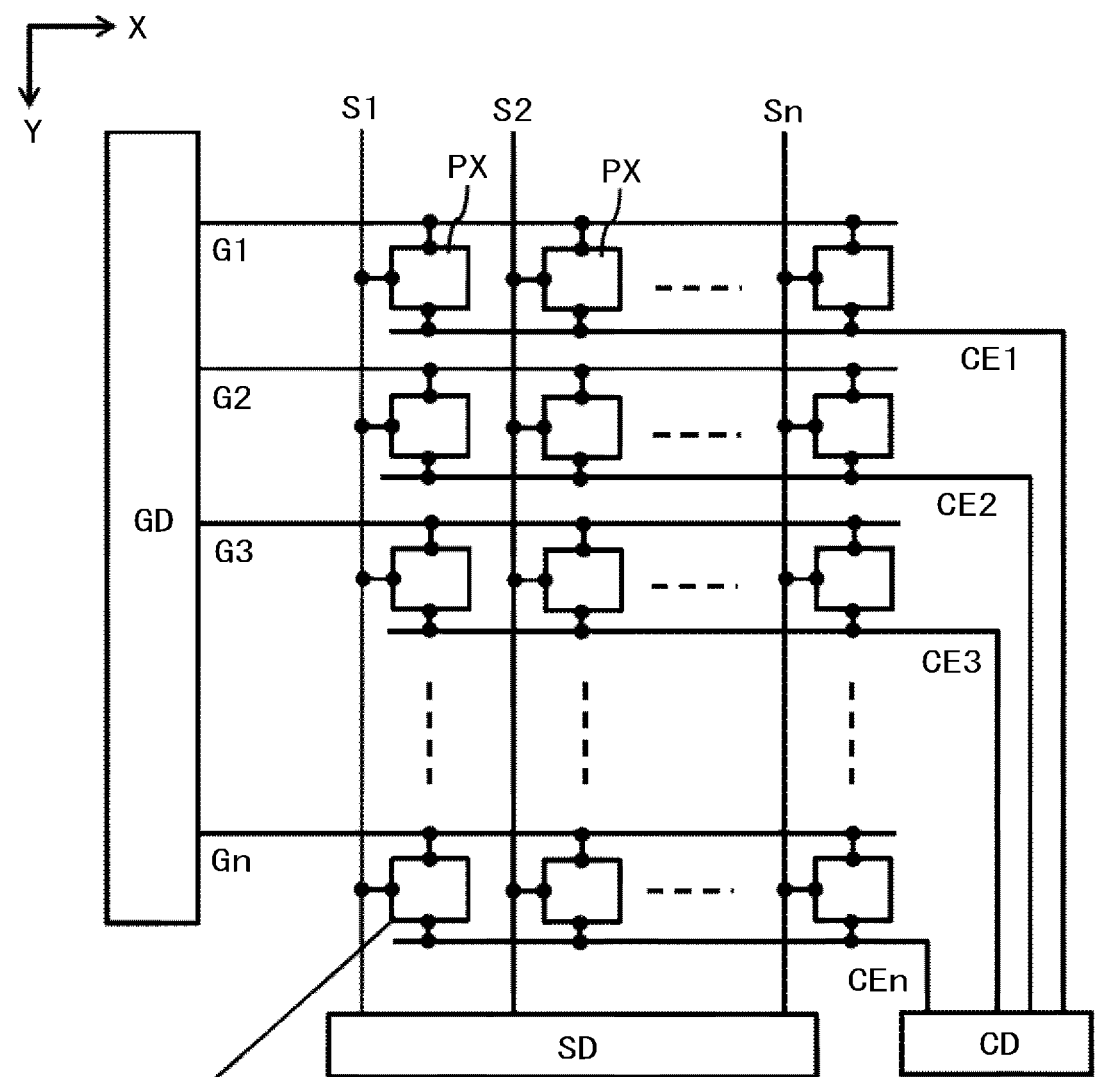
FIG. 3 is a diagram showing the basic configuration of a pixel PX and an equivalent circuit of the display device DSP.

FIG. 3 is a diagram showing the basic configuration of the pixel PX and an equivalent circuit of the display device DSP. Plural pixels PX are disposed in a matrix shape in the first direction X and in the second direction Y. Plural scanning lines G (G1, G2, . . . ) are connected to a scanning line drive circuit GD. Plural signal lines S (S1, S2, . . . ) are connected to a signal line drive circuit SD. Plural common electrodes CE (CE1, CE2, . . . ) are connected to a voltage supply unit CD that supplies a common voltage (Vcom), and each of the plural common electrodes CE is disposed for a constant number of plural pixels PX. One pixel PX is connected to one scanning line, one signal line, and one common electrode CE. Here, it is not always necessary that the scanning lines G and the signal lines S are linearly extending, and it is all right if parts of these lines are bent. For example, even if parts of the signal lines S are bent, it will be assumed that the signal lines S are extending in the second direction Y. The scanning line drive circuit GD, the signal line drive circuit SD, and the voltage supply unit CD include thin film transistors (TFTs).

Each pixel PX includes: a switching element SW; a pixel electrode PE; a common electrode CE; a liquid crystal layer LC; and the like. The switching element SW is composed of, for example, a thin film transistor (TFT) and electrically connected to a scanning line G and a signal line S. The scanning line G is connected to the switching element SW of each of pixels PX arranged in parallel with one another in the first direction X. The signal line S is connected to the switching element SW of each of pixels PX arranged in parallel with one another in the second direction Y. The pixel electrode PE is electrically connected to the switching element SW. Each of the pixel electrodes PE faces the common electrode CE, and the liquid crystal layer LC is driven by an electric field induced between the pixel electrode PE and the common electrode CE. A retention capacitor CS is formed, for example, between an electrode having the same potential as the common electrode CE and an electrode having the same potential as the pixel electrode PE.

Configuration Example of Thin Film Transistor

Figure 4:
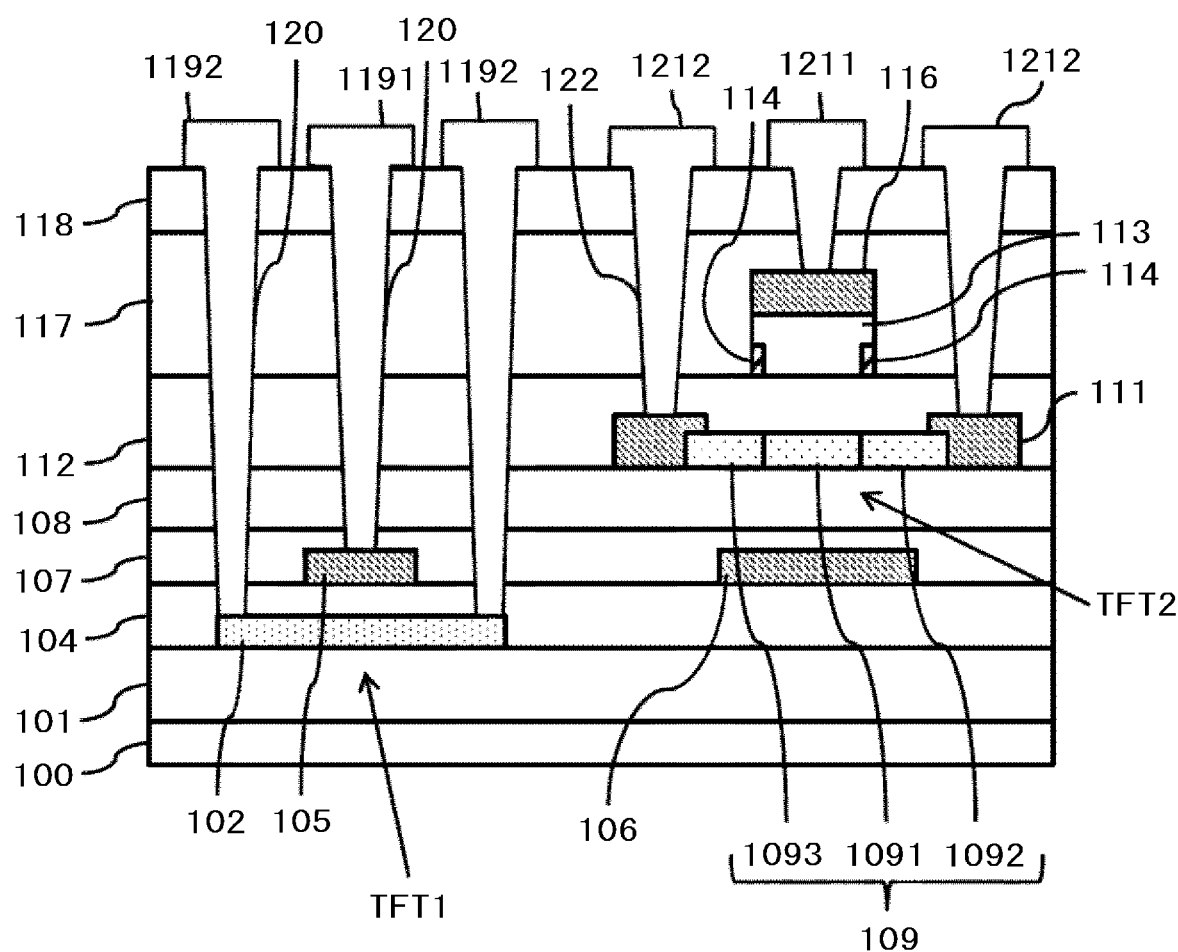
FIG. 4 is a cross-sectional view showing the configuration of a semiconductor device according to the embodiment.

FIG. 4 is a cross-sectional view showing the configuration of a semiconductor device according to the embodiment. The semiconductor device 10 shown in FIG. 4 is the first substrate SUB1 including plural thin film transistors TFT1 and TFT2. In FIG. 4, the left thin film transistor (first thin film transistor) TFT1 is a thin film transistor using LTPS (also referred to as an LTPS TFT), and the right thin film transistor (second thin film transistor) TFT2 is a thin film transistor using oxide semiconductor (OS) (also referred to as an OS TFT). The semiconductor device 10 is a semiconductor device embedded in the display panel PNL.

The semiconductor device 10 includes: a substrate 100; a foundation film 101; a first semiconductor layer 102; a first gate insulating film 104; a first gate electrode 105; a light shielding layer 106; a first insulating film 107; a second insulating film 108; a second semiconductor layer 109; a second gate insulating film 112; an aluminum oxide film (AlO film) 113; a second gate electrode 116; a third insulating film 117; a fourth insulating film 118; and the like. Here, the AlO film 113 is an example, and a film used in this case is not limited to the AlO film 113. An AlO film can be replaced with an oxide semiconductor film including a large amount of oxygen. The AlO film 113 is, as described later, a film used for supplying oxygen to the channel region 1091 of the second semiconductor layer 109. That is to say, because the film 113 works well as long as it is a means (a film or a layer) capable of supplying oxygen to the channel region of oxide semiconductor, an AlO film or any of oxide semiconductor films (OS films) including a large amount of oxygen can be used. Hereinafter the AlO film is used in the following descriptions as a representative of these films.

In FIG. 4, the foundation film 101 is formed on the substrate 100 composed of glass or resin. The foundation film 101 is used for blocking impurities from glass and the like, and the foundation film 101 is usually formed of silicon oxide SiO, silicon nitride SiN, or the like through CVD. Here, a notation such as AB (for example SiO) shows that AB is a chemical compound the constituent atoms of which are A and B but does not mean that the composition ratios of A and B are the same.

The first semiconductor layer 102 for the LTPS TFT is formed on the foundation film 101. The first semiconductor layer 102 is formed of LTPS. The first gate insulating film 104 is formed so as to cover the first semiconductor layer 102. The first semiconductor layer 102 can be formed, for example, in such a way that, after amorphous silicon (a-Si) is formed, annealing is executed on the a-Si to dehydrogenate the a-Si, the a-Si is irradiated with an excimer laser to be converted into polycrystalline silicon (Poly-Si), and afterward the Poly-Si is patterned. The first gate insulating film 104 can be formed of SiO the raw material of which is TEOS (Tetraethyl Orthosilicate).

The first gate electrode 105 and the light shielding layer 106 are formed on the first gate insulating film 104. The first gate electrode 105 and the light shielding layer 106 are formed by a laminate film obtained by laminating Ti, an Al alloy, Ti, etc.; an MoW alloy; or the like. The light shielding layer 106 is installed to prevent light from the backlight 202 from being emitted to the channel region 1091 of the OS TFT.

The first insulating film 107 is formed so as to cover the first gate electrode 105, the light shielding layer 106, and the first gate insulating film 104. The first insulating film 107 is formed of SiN through CVD. The second insulating film 108 is formed on the first insulating film 107. The second insulating film 108 is formed of SiO through CVD.

The second semiconductor layer 109 for the OS TFT is formed on the second insulating film 108. The second semiconductor layer 109 is formed of OS. The second semiconductor layer 109 includes the channel region 1091, a drain region 1092, and a source region 1093. The channel region 1091 is formed between the drain region 1092 and the source region 1093. Therefore, the thin film transistor TFT2 is located higher than the thin film transistor TFT1 viewed from the substrate 100.

Protective metal layers 111 are installed at one edge and the other edge of the second semiconductor layer 109 respectively. In other words, one metal layer 111 is connected to the edge of the drain region 1092 that has no contact with the channel region 1091, and the other metal layer 111 is connected to the edge of the source region 1093 that has no contact with the channel region 1091. The metal layers 111 are formed of titanium (Ti) for example.

The second gate insulating film 112 is formed so as to cover the second insulating film 108, the second semiconductor layer 109, and the metal layers 111. The second gate insulating film 112 is formed of SiO through CVD using $SiH_4$ (silane) and $N_2O$ (dinitrogen monoxide).

The aluminum oxide film (hereinafter referred to as the AlO film) 113 is formed on a portion of the second gate insulating film 112 located on the channel region 1091. Block layers 114 are formed in the left lower portion and the right lower portion of the AlO film 113 respectively. The second gate electrode 116 is formed on the AlO film 113. Therefore, the AlO film 113 is selectively formed on the downside of the second gate electrode 116. Furthermore, the AlO film 113 and the second gate electrode 116 are formed in island shapes respectively when the entirety of the semiconductor device 10 is viewed in a plane view. The second gate electrode 116 is formed by, for example, a laminate film obtained by laminating Ti, an Al alloy, Ti, etc.; an MoW alloy; or the like. The AlO film 113 is formed on the downside of the second gate electrode 116 and it is also conceivable that the AlO film 113 is formed above the channel region 1091. The AlO film 113 has the role of supplying oxygen to the channel region 1091 of the second semiconductor layer 109. Oxygen is supplied to the channel region 1091 from the AlO film 113 located between the two block layers 114. The block layers 114 are used for preventing oxygen from leaking into the drain region 1092 and the source region 1093. The block layers 114 can be formed of OS having low oxygen concentration or SiN. As mentioned above, an oxide semiconductor film containing a large amount of oxygen can also be used instead of the AlO film 113.

The third insulating film 117 is formed so as to cover the second gate insulating film 112, the second gate electrode 116, the AlO film 113, and the block layers 114. The third insulating film 117 is formed of SiN. The fourth insulating film 118 is formed on the third insulating film 117. The fourth insulating film 118 is formed of SiO.

Afterward, contact holes 120 for forming a gate electrode wiring 1191 and source/drain electrode wirings 1192 in the LTPS TFT and contact holes 122 for forming a gate electrode wiring 1211 and source/drain electrode wirings 1212 in the OS TFT are formed. The contact holes 120 and 122 are formed through dry etching using, for example, CF-based (e.g. $CF_4$) gas or CHF-based (e.g. $CHF_3$) gas. One contact hole 120 is formed penetrating through a five-layered insulating film and two contact holes 120 are formed penetrating through a six-layered insulating film in the LTPS TFT, while one contact hole 122 is formed penetrating through a two-layered insulating film and two contact holes 122 are formed penetrating through a three-layered insulating film in the OS TFT. Subsequently, the contact holes 120 and 122 are cleaned using an HF-based cleaning liquid, and after the cleaning, the gate electrode wiring 1191, the source/drain electrode wirings 1192, the gate electrode wiring 1211, and the source/drain electrode wirings 1212 are formed. Here, in the present specification, source electrode wirings 1192 and drain electrode wirings 1192 are represented by the source/drain electrode wirings 1192 in a lot, and source electrode wirings 1212 and drain electrode wirings 1212 are represented by the source/drain electrode wirings 1212 in a lot as well. The gate electrode wirings 1191 and 1211, and the source/drain electrode wirings 1192 and 1212 can be formed by, for example, a laminate film obtained by laminating Ti, an Al alloy, Ti, etc.

As shown in FIG. 4, the one contact hole 120 is formed penetrating through the five-layered insulating film (composed of the insulating films 118, 117, 112, 108, and 107) and the two contact holes 120 are formed penetrating through the six-layered insulating film (composed of the insulating films 118, 117, 112, 108, 107, and 104) in the LTPS TFT, while the one contact hole 122 is formed penetrating through the two-layered insulating film (composed of the insulating films 118 and 117) and the two contact holes 122 are formed penetrating through the three-layered insulating film (composed of the insulating films 118, 117, and 112) in the OS TFT. Therefore, etching condition for forming contact holes needs to meet the requirements of the LTPS TFT. That is to say, the OS TFT is exposed to etching gas and cleaning liquid for a longer time than necessary, but the second semiconductor layer 109 is prevented from being eliminated by installing the protective metal layers 111, so that the OS TFT can be formed stably.

In such a way, sufficient oxygen is supplied to the channel region 1091 of the second semiconductor layer 109 from the AlO film 113, so that the resistance of the channel region 1091 is made high. On the other hand, because the block layers 114 prevent oxygen from being supplied from the AlO film 113 to the drain region 1092 and the source region 1093 of the second semiconductor layer 109, the resistances of the drain region 1092 and the source region 1093 are made low. Therefore, it becomes possible to make the OS TFT have favorable transistor characteristics. In addition, a semiconductor device such as a display device including OS TFTs having favorable transistor characteristics can be materialized.

Furthermore, because both edges of the channel region 1091 is made to have high resistances by leaving behind portions of the block layer 114 at both edges of the AlO film 113, that is to say, at the portions of the AlO film 113 corresponding to both edges of the channel region 1091, a current through the OS TFT does not flow smoothly, so that the OS TFT having a favorable switching characteristic can be materialized.

Method of Manufacturing Thin Film Transistor

Manufacturing steps for materializing the semiconductor device 10 explained in FIG. 4 will be described respectively with reference to FIG. 5 to FIG. 16.

Figure 5:
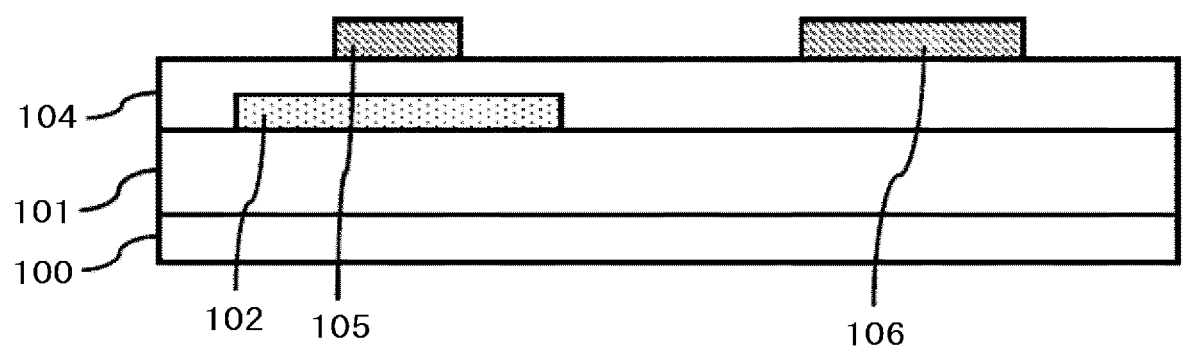
FIG. 5 is a cross-sectional view showing a state in which a first gate electrode is formed.

FIG. 5 is a cross-sectional view showing a state in which the foundation film 101 is formed on the substrate 100 having an insulation characteristic, the first semiconductor layer 102 is formed on the foundation film 101, the first gate insulating film 104 is formed so as to cover the first semiconductor layer 102, and the first gate electrode 105 and the light shielding layer 106 are formed on the first gate insulating film 104. After the first gate electrode 105 is formed, the first gate electrode 105 is used as a mask, and B (boron) or P (phosphor) is doped into the first semiconductor layer 102 through ion implantation. With this, P type or N type electrical conductivity is given to portions of the first semiconductor layer 102 that are not covered by the first gate electrode 105, so that a drain region and a source region are formed in the semiconductor layer 102.

Figure 6:
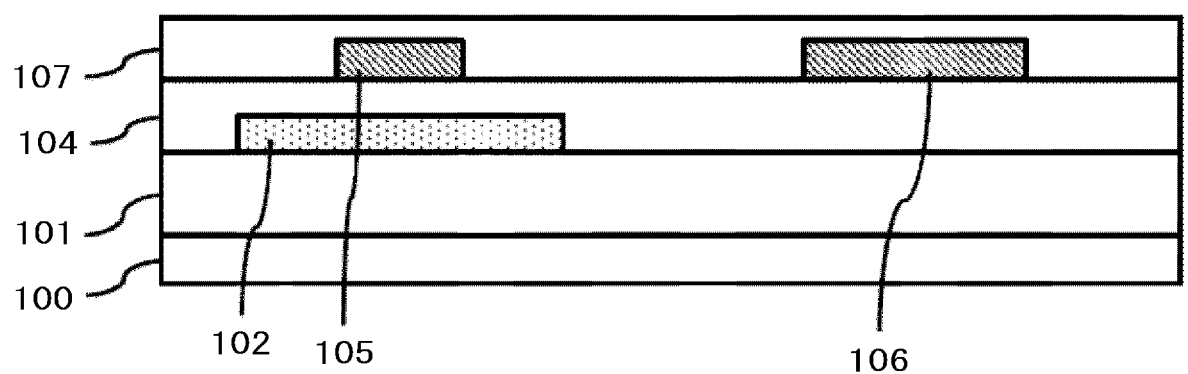
FIG. 6 is a cross-sectional view showing a state in which a first insulating film is formed.

FIG. 6 is a cross-sectional view showing a state in which the first insulating film 107 is formed so as to cover the first gate electrode 105, the light shielding layer 106, and the first gate insulating film 104. The first insulating film 107 is formed of SiN through CVD.

Figure 7:
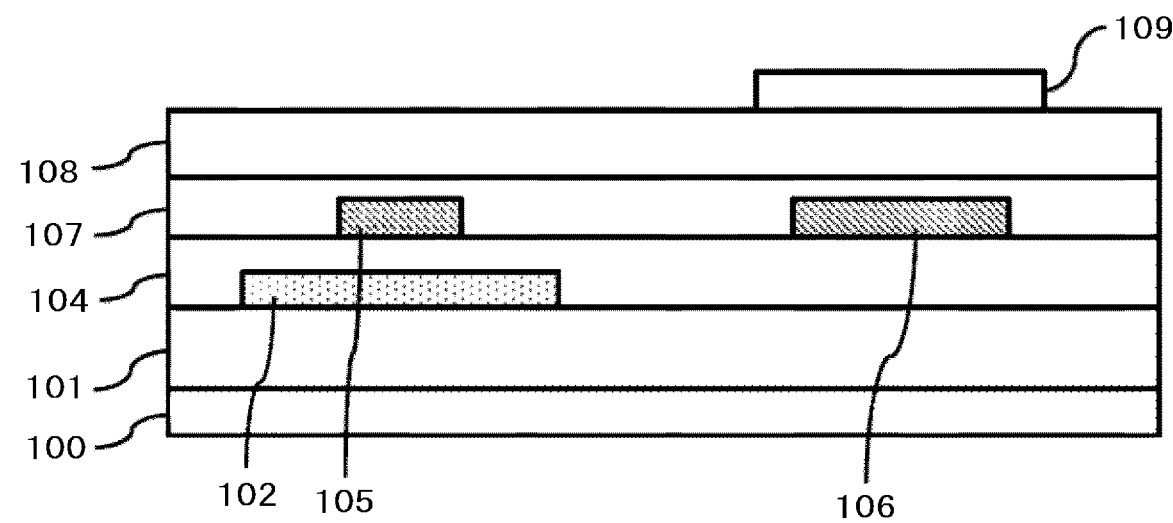
FIG. 7 is a cross-sectional view showing a state in which a second semiconductor layer is formed.

FIG. 7 is a cross-sectional view showing a state in which the second insulating film 108 is formed on the first insulating film 107, and the second semiconductor layer 109 is selectively formed on the second insulating film 108. The second insulating film 108 is formed of SiO through CVD. The second semiconductor layer 109 is formed of OS.

Figure 8:
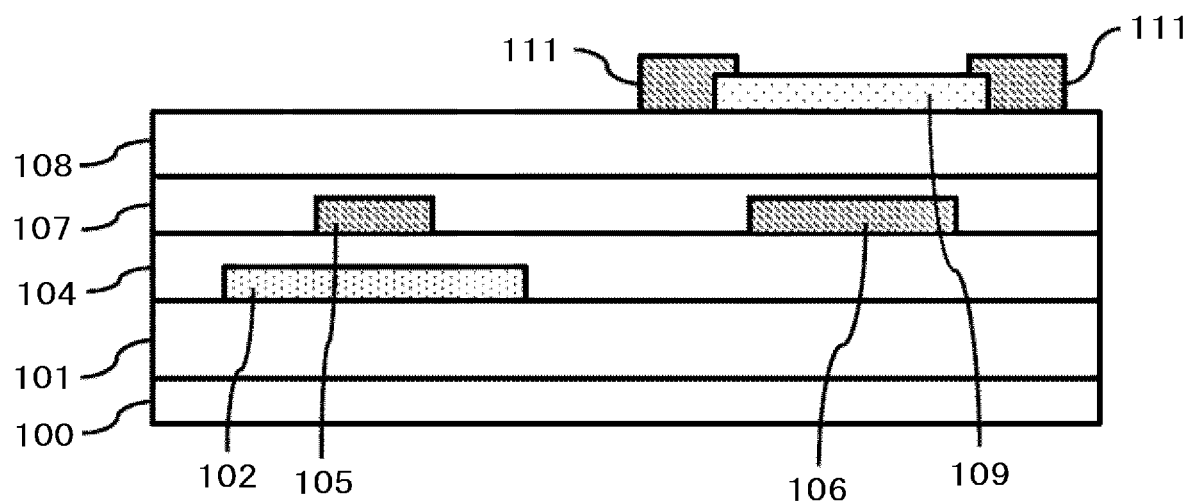
FIG. 8 is a cross-sectional view showing a state in which protective metal layers are formed.

FIG. 8 is a cross-sectional view showing a state in which the protective metal layers 111 are selectively formed at both edges of the second semiconductor layer 109. The metal layers 111 are formed of, for example, Ti. The protective metal layers 111 are protective films for preventing the second semiconductor layer 109 from being eliminated by the etching gas and the cleaning liquid when the contact holes (120 and 122) are formed as explained in FIG. 4.

Figure 9:
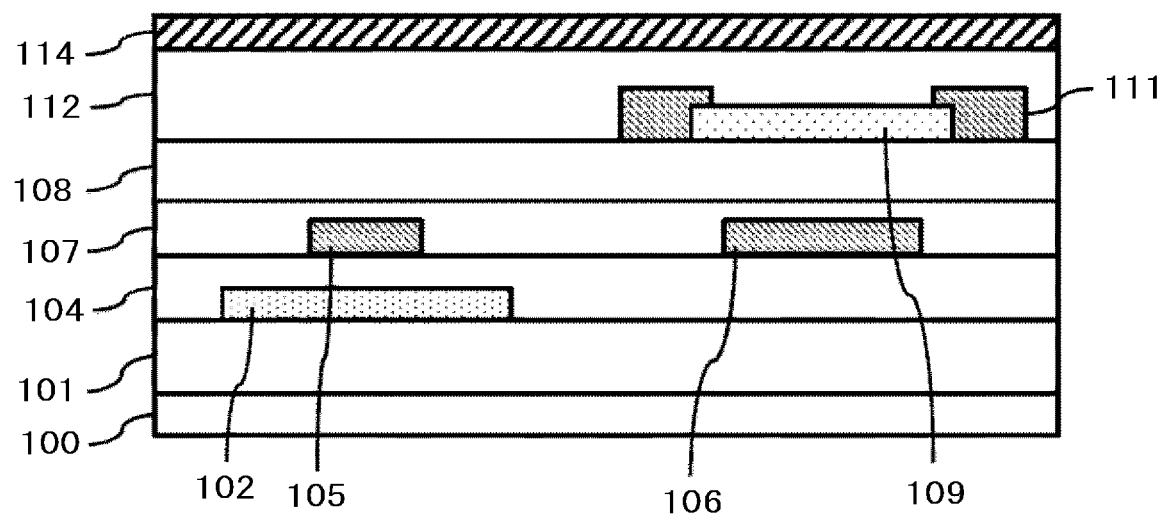
FIG. 9 is a cross-sectional view showing a state in which a block layer is formed.

FIG. 9 is a cross-sectional view showing a state in which the second gate insulating film 112 is formed so as to cover the second insulating film 108, the second semiconductor layer 109, and the metal layers 111, and a block layer 114 is formed on the second gate insulating film 112. The second gate insulating film 112 can be formed of SiO through CVD using $SiH_4$ (silane) and $N_2O$ (dinitrogen monoxide). The block layer 114 can be formed of OS having low oxygen concentration or SiN. The film thickness of the block layer 114 is, for example, about 10 nm to 30 nm.

Figure 10:
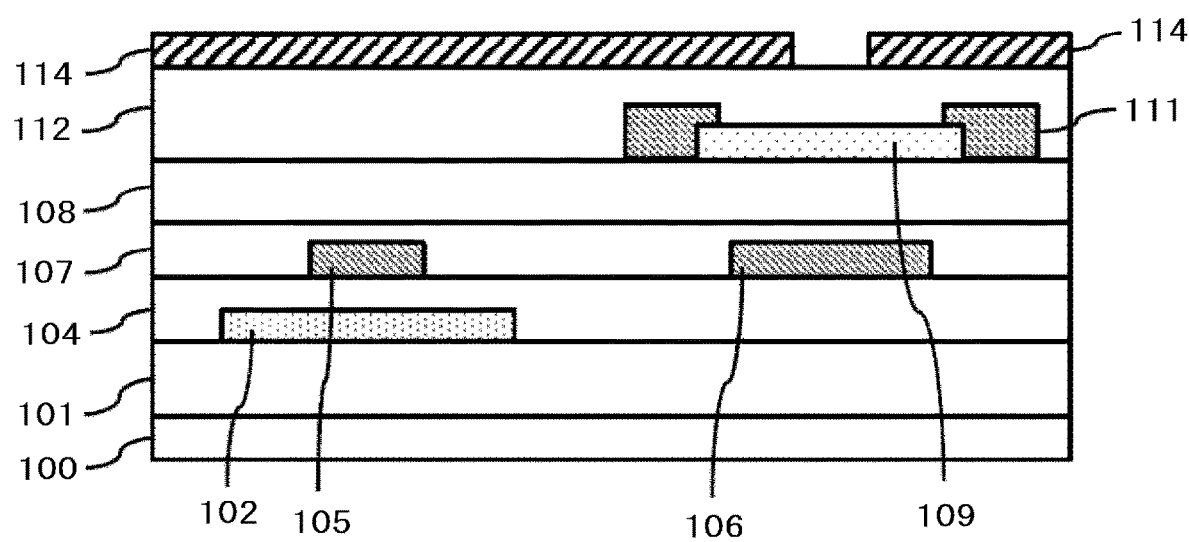
FIG. 10 is a cross-sectional view showing a state in which the block layer is patterned.

FIG. 10 is a cross-sectional view showing a state in which the block layer 114 are selectively patterned. The block layer 114 is selectively patterned so as to have an opening that covers a portion of the second gate insulating film 112 located on the channel region (1091) of the second semiconductor layer 109 in a cross-sectional view and in a plane view.

Figure 11:
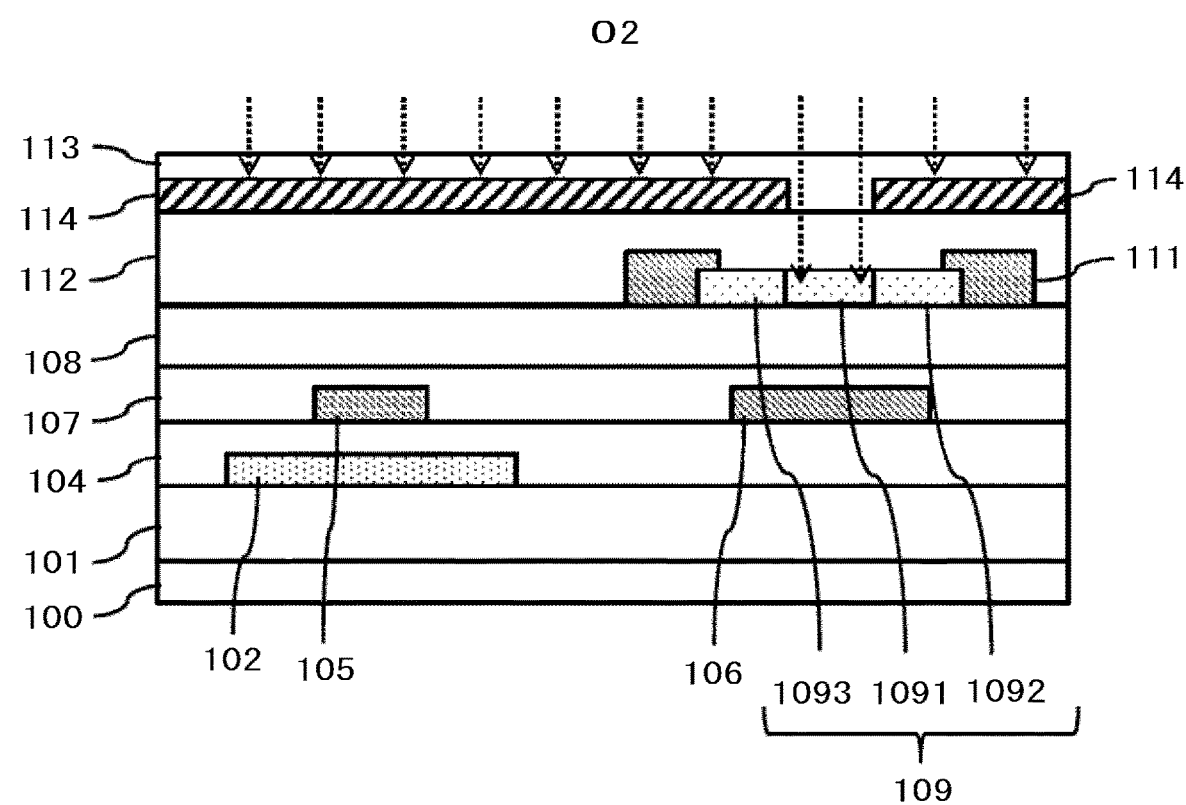
FIG. 11 is a cross-sectional view showing a state in which an aluminum oxide film is formed.

FIG. 11 is a cross-sectional view showing a state in which the AlO film 113 is formed on the block layer 114 and on a portion of the second gate insulating film 112 that is exposed from the opening of the block layer 114. Because the AlO film 113 is formed through reactive spattering, the AlO film 113 includes a large amount of oxygen. This oxygen stabilizes the insulating resistance of the channel region 1091 of the second semiconductor layer 109. To put it concretely, although oxygen $O_2$ included in the AlO film 113 at the time of the AlO film 113 being formed is blocked by the block layer 114, a large amount of oxygen is introduced into the channel region 1091 of the second semiconductor layer 109 because there is no block layer 114 over the channel region 1091, so that the channel region 1091 is excessively oxidized and has a high resistance. On the other hand, because the supply of oxygen to the drain region 1092 and the source region 1093 of the second semiconductor layer 109 is blocked by the block layer 114, the drain region 1092 and the source region 1093 are not excessively oxidized, so that low resistances of the drain region 1092 and the source region 1093 can easily be kept unchanged.

As described above, oxide semiconductor film including a large amount of oxygen can be used instead of the AlO film 113. In addition, in the present specification, when explanations are made about a region in which the channel region 1091 is to be formed, a region in which the drain region 1092 is to be formed, and a region in which the source region 1093 is to be formed, these regions are referred to as the channel region 1091, the drain region 1092, and the source region 1093 respectively for simplifying the explanations.

Figure 12:
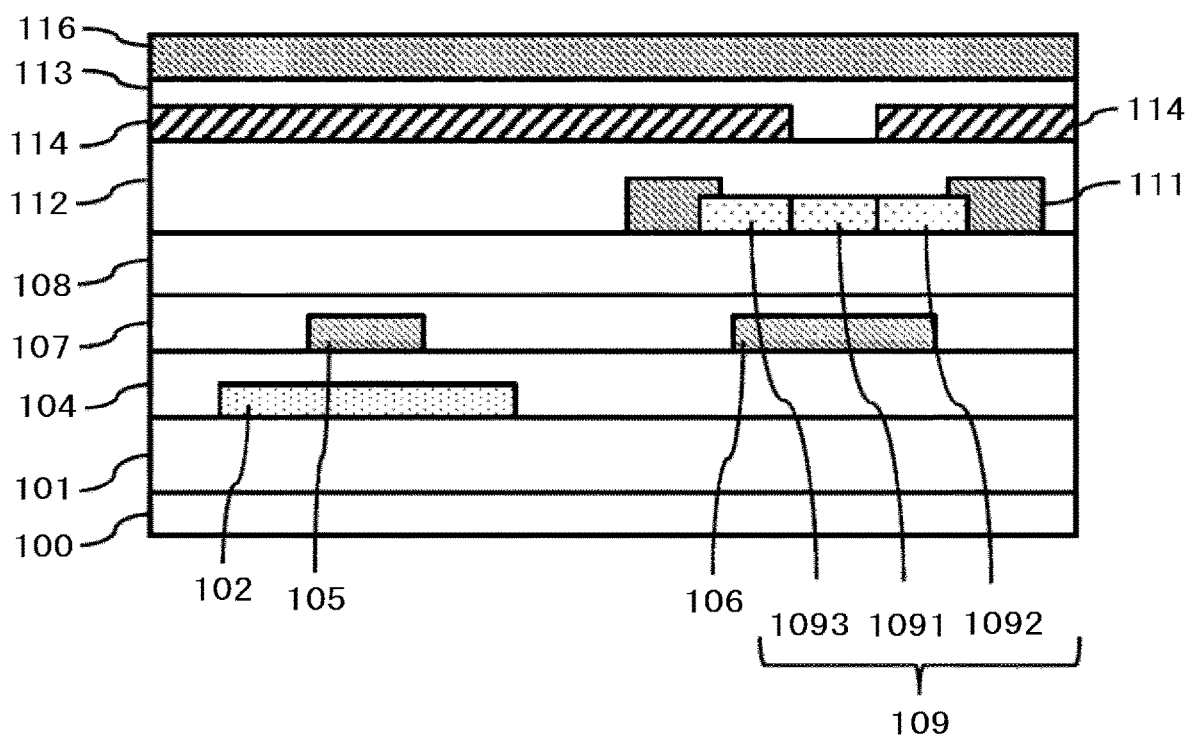
FIG. 12 is a cross-sectional view showing a state in which a second gate electrode is formed.

FIG. 12 is a cross-sectional view showing a state in which the second gate electrode 116 is formed on the AlO film 113. The second gate electrode 116 is formed by, for example, a laminate film obtained by laminating Ti, an Al alloy, Ti, etc.; an MoW alloy; or the like.

Figure 13A:
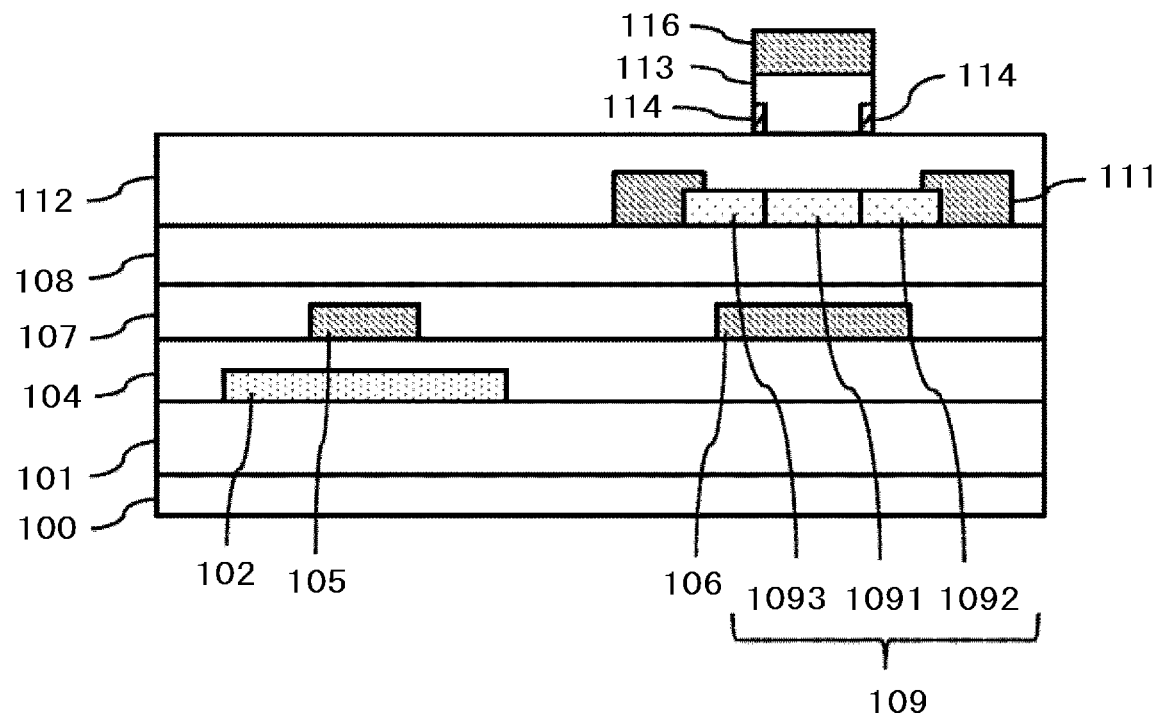
FIG. 13A is a cross-sectional view showing a state in which the second gate electrode is patterned.
Figure 13B:
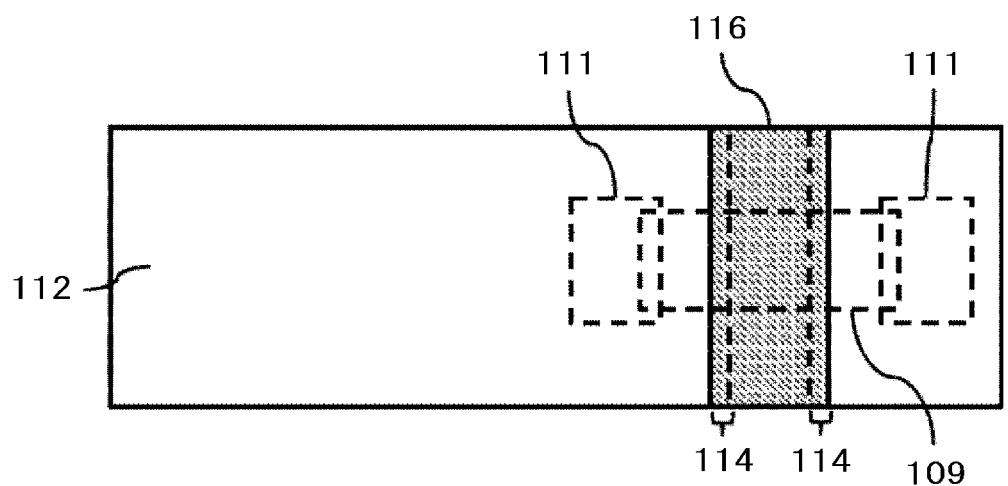
FIG. 13B is a plan view showing the overhead view of the state shown by FIG. 13A.

FIG. 13A is a cross-sectional view showing a state in which block layers 114, the AlO film 113, and the second gate electrode 116 are selectively patterned. FIG. 13B is a plan view showing the overhead view of the state shown in FIG. 13A. As shown in FIG. 13A, the block layers 114, the AlO film 113, and the second gate electrode 116 are selectively patterned so as to cover a portion of the second gate insulating film 112 located on the channel region (1091) of the second semiconductor layer 109. An AlO film 113 is selectively formed on the downside of the second gate electrode 116. Therefore, the AlO film 113 and a second gate electrode 116 are formed in an island shape when the entirety of the semiconductor device 10 is viewed in a plane view.

Next, ion plantation is executed using the second gate electrode 116 as a mask, so that electrical conductivity is given to portions of the second semiconductor layer 109 that are not covered by the second gate electrode 116. As shown in FIG. 13B, ion implantation is effectively executed in portions of the drain region 1092 and the source region 1093 that are not covered by the AlO film 113 and block layers 114. As ions used in the ion implantation, B (boron) ions, P (phosphor) ions, Ar (argon) ions, or the like are used. Through the ion implantation, the drain region 1092 and the source region 1093 having electrical conductivity are formed in the second semiconductor layer 109. Subsequently, activation processing is executed in a hydrogen atmosphere, and the drain region 1092 and the source region 1093 are made to have low resistances. Therefore, a thin film transistor that is made using oxide semiconductor (OS) and has stable characteristics can be materialized.

Figure 14:
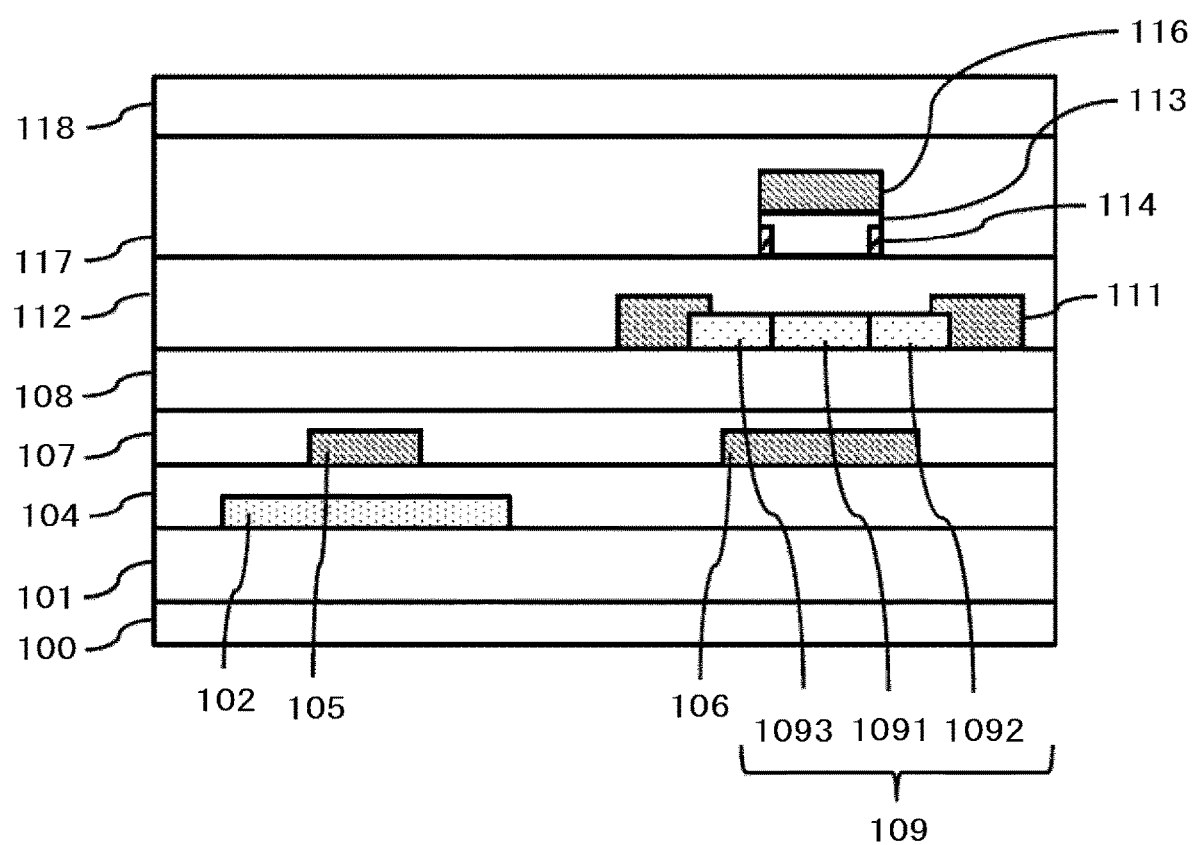
FIG. 14 is a cross-sectional view showing a state in which a fourth insulating film is formed.

FIG. 14 is a cross-sectional view showing a state in which, after the third insulating film 117 is formed so as to cover the second gate insulating film 112, and the selectively patterned block layers 114, AlO film 113, and second gate electrode 116, the fourth insulating film 118 is formed on the third insulating film 117. The third insulating film 117 is formed of SiN through CVD. The fourth insulating film 118 is formed of SiO through CVD.

Figure 15:
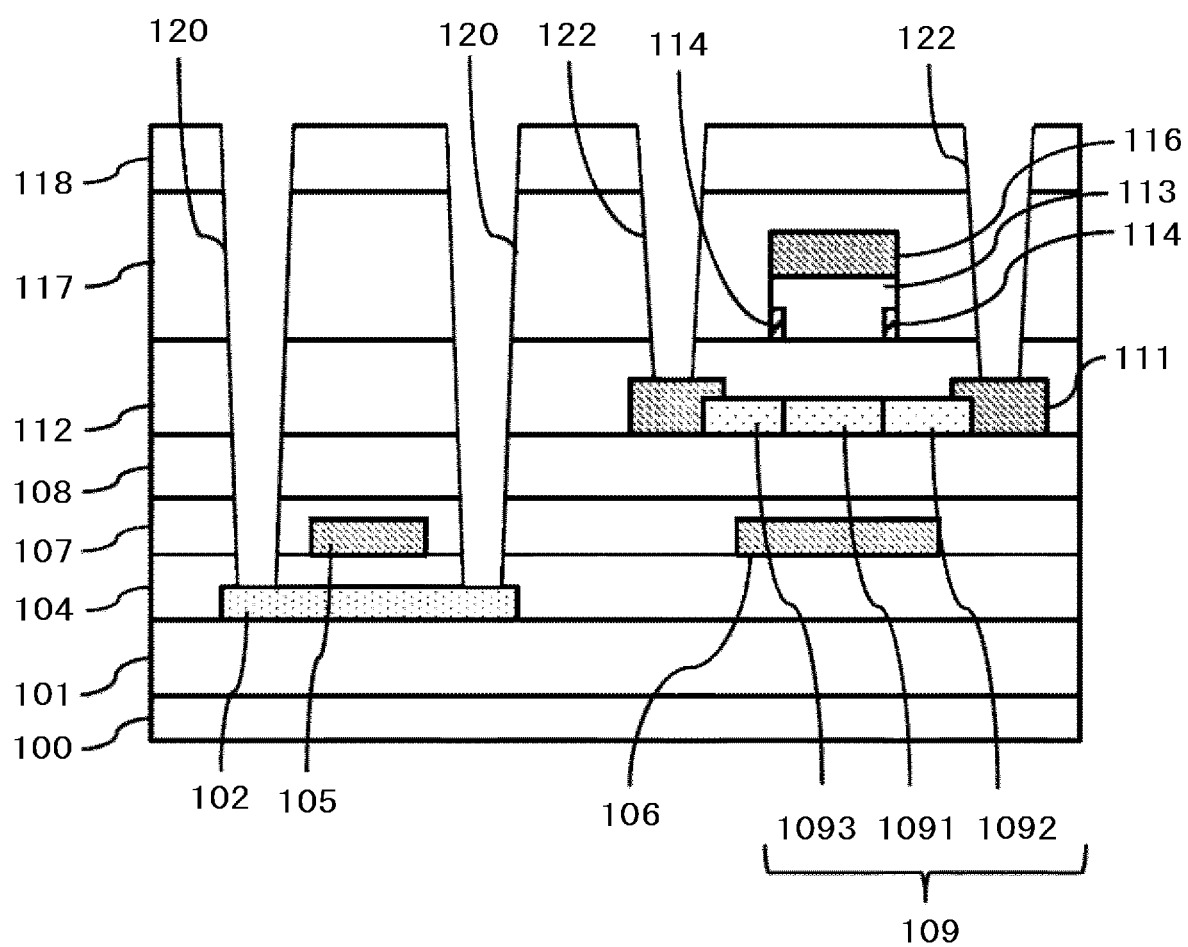
FIG. 15 is a cross-sectional view showing a state in which contact holes are formed.

FIG. 15 is a cross-sectional view showing a state in which the contact holes 120 and the contact holes 122 are formed. The contact holes 120 and the contact holes 122 are formed by dry etching using, for example, CF-based (e.g. $CF_4$) gas or CHF-based (e.g. $CHF_3$) gas. The contact holes 120 and the contact holes 122 can be formed at the same time. In the LTPS TFT, the contact holes 120 are formed penetrating the six-layered insulating film (composed of the insulating films 118, 117, 112, 108, 107, and 104) so that the upper portions of the drain region and the source region of the first semiconductor layer 102 are exposed. In the OS TFT, the contact holes 122 are formed penetrating the three-layered insulating film (composed of the insulating films 118, 117, and 112) so that the metal layers 111 are exposed. Subsequently, the contact holes 120 and 122 are cleaned using the HF-based cleaning liquid.

Figure 16:
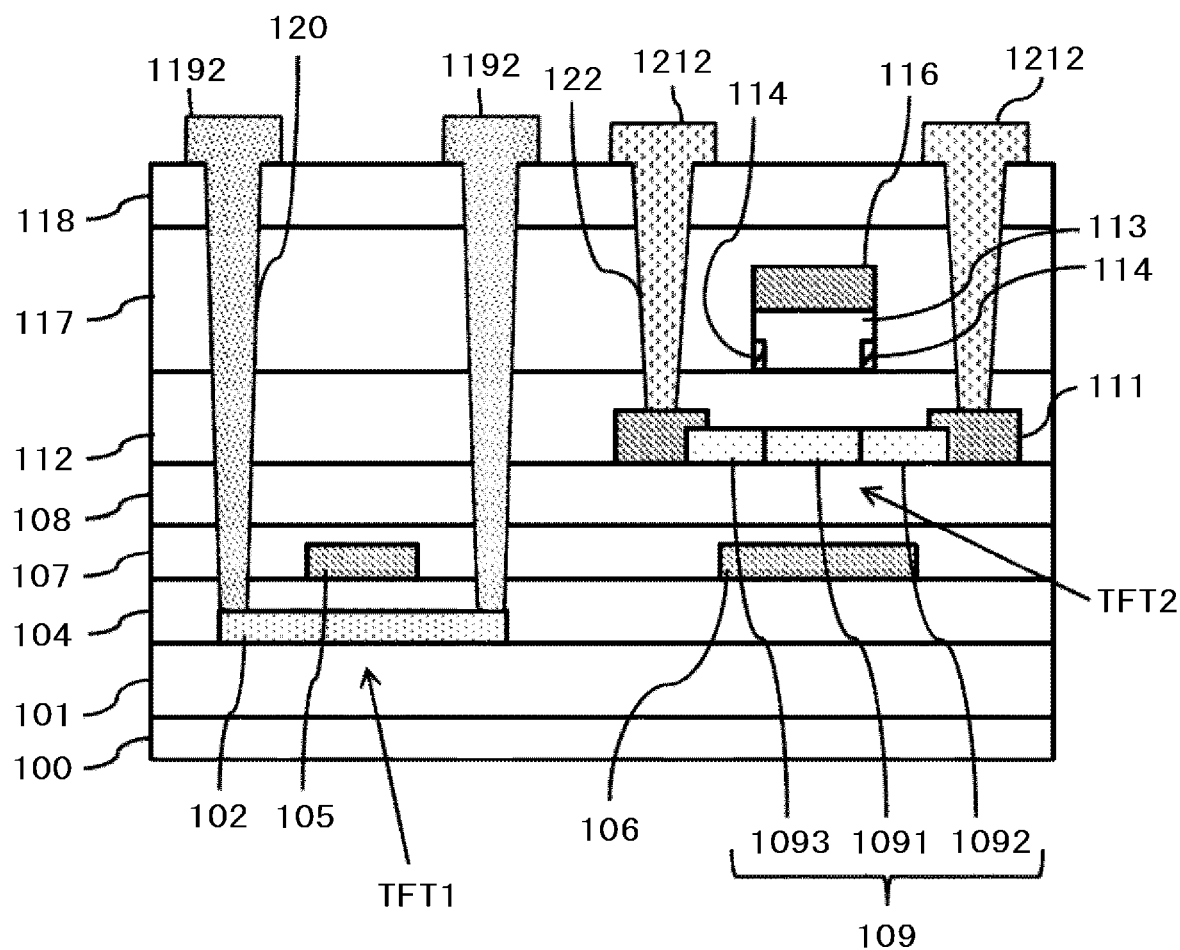
FIG. 16 is a cross-sectional view showing a state in which source/drain electrode wirings are formed.

FIG. 16 is a cross-sectional view showing a state in which the source/drain electrode wirings 1192 and 1212 are formed in the contact holes 120 and 122 respectively. After the contact holes 120 and 122 are cleaned, the source/drain electrode wirings 1192 and 1212 are formed in the contact holes 120 and 122 respectively. In other words, in the LTPS TFT, the source/drain electrode wirings 1192 are formed in the contact holes 120 respectively. In the OS TFT, the source/drain electrode wirings 1212 are formed in the contact holes 122 respectively.

Here, although the gate electrode wirings 1191 and 1211, which are shown in FIG. 4, are not shown in FIG. 15 and FIG. 16, it is also conceivable that these gate electrode wirings 1191 and 1211 are formed in FIG. 15 and FIG. 16 as shown in FIG. 4. In this case, in the LTPS TFT, a contact hole 120 is formed penetrating through the five-layered insulating film (composed of the insulating films 118, 117, 112, 108, and 107) so that the first gate electrode 105 is exposed, and the gate electrode wiring 1191 is formed in the contact hole 120. Furthermore, in the OS TFT, a contact hole 122 is formed penetrating through the two-layered insulating film (composed of the insulating films 118 and 117) so that the second gate electrode 116 is exposed, and the gate electrode wiring 1211 is formed in the contact hole 122. With this, a configuration similar to the configuration of the semiconductor device 10 the cross-sectional view of which is shown in FIG. 4 can be formed.

MODIFICATION EXAMPLE

In the abovementioned embodiment, the semiconductor device 10 such as the display device including the LTPS TFT and the OS TFT has been explained. In the following modification example, a semiconductor device 10a such as a display device including only an OS TFT will be explained. In this case, the protective metal layers 111 connected to the drain region 1092 and the source region 1093 can be deleted from the configuration of the OS TFT shown in FIG. 4. Therefore, because the formation and patterning processes of the metal layers 111 and the cleaning process of the relevant contact holes can be deleted, the total length of the manufacturing processes can be shortened.

Figure 21:
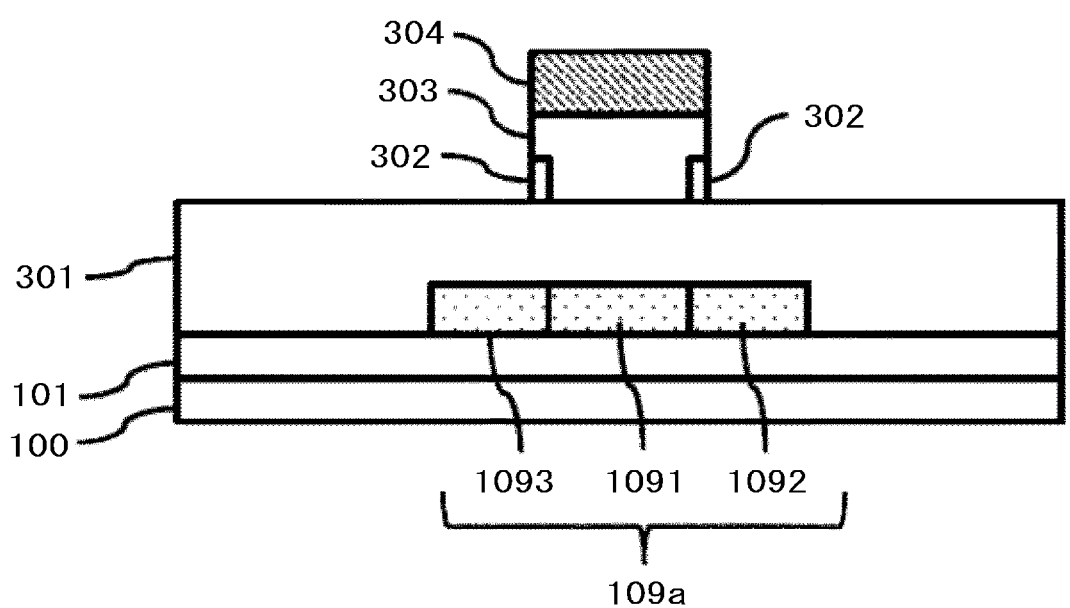
FIG. 21 is a cross-sectional view showing a state in which the gate electrode is patterned.
Figure 22:
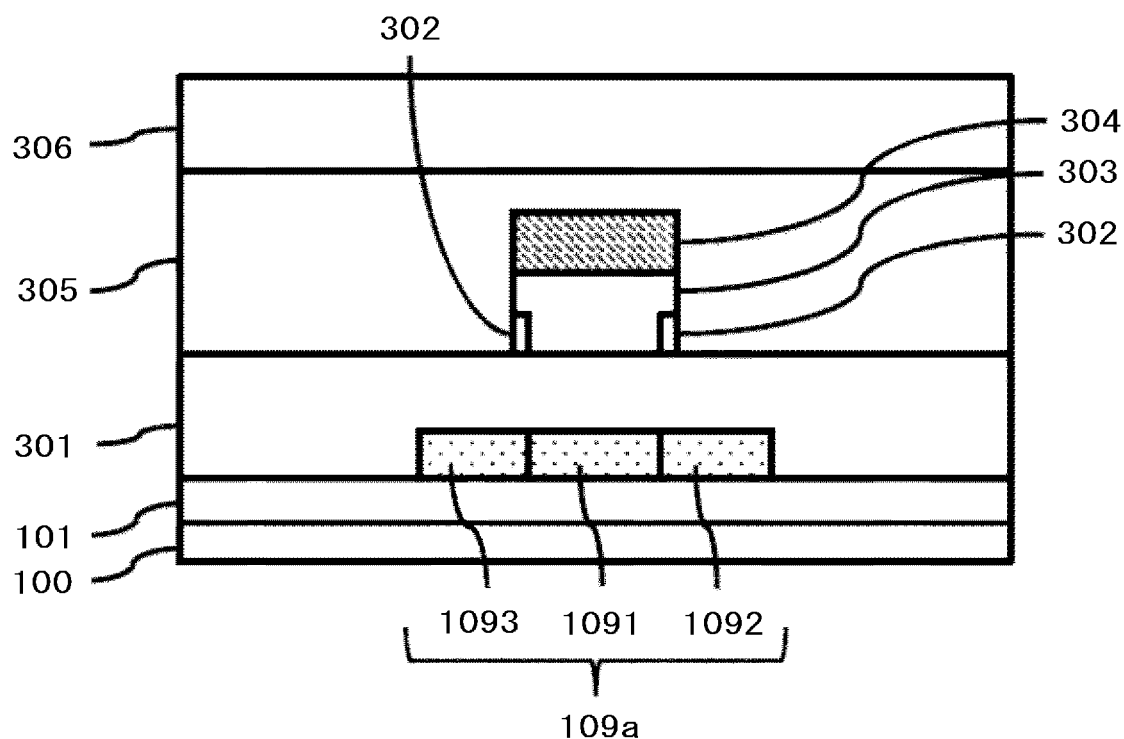
FIG. 22 is a cross-sectional view showing a state in which a second insulating film is formed.
Figure 23:
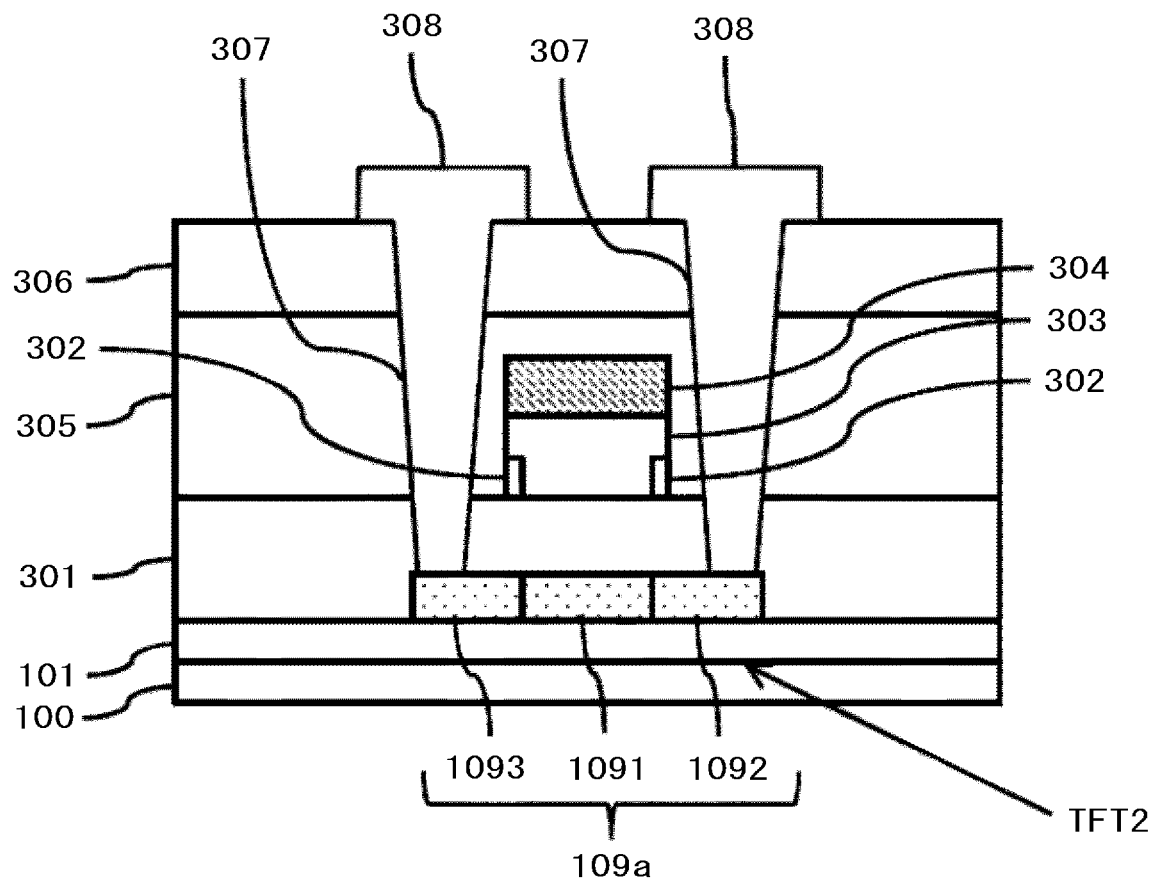
FIG. 23 is a cross-sectional view showing a state in which source/drain electrodes are formed.

FIG. 17 to FIG. 23 are cross-sectional views showing the manufacturing processes of the semiconductor device 10a according to the modification example. As shown in FIG. 23, the semiconductor device 10a is a first substrate SUB1 including a thin film transistor TFT2 (OS TFT) using oxide semiconductor (OS). The semiconductor device 10a is a semiconductor device embedded in a display panel. Hereinafter a method of manufacturing the semiconductor device 10a according to the modification example will be explained with reference to FIG. 17 to FIG. 23.

Figure 17:
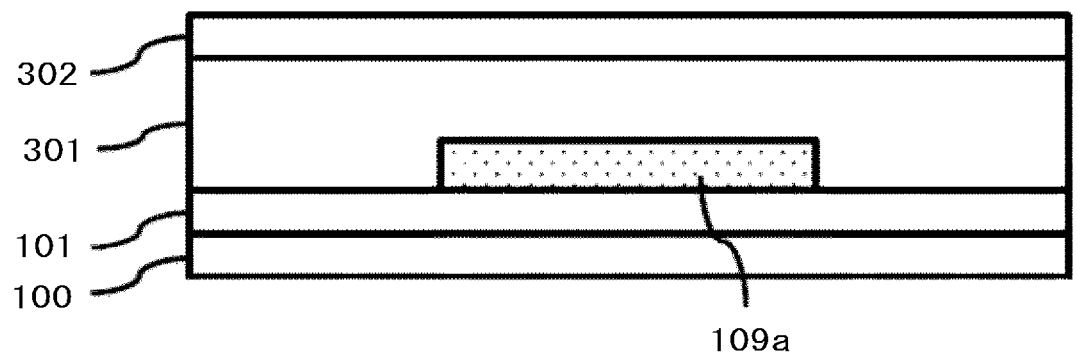
FIG. 17 is a cross-sectional view showing a block layer according to a semiconductor device of a modification example.

FIG. 17 is a cross-sectional view showing a state in which a foundation film 101 is formed on a substrate 100 having an insulation characteristic, a semiconductor layer 109a is formed on the foundation film 101, a gate insulating film 301 is formed so as to cover the foundation film 101 and the semiconductor layer 109a, and a block layer 302 is formed on the gate insulating film 301. The substrate 100 is formed of glass or resin. The foundation film 101 is formed of silicon oxide SiO, silicon nitride SiN, or the like through CVD. The semiconductor layer 109a is formed of OS. The gate insulating film 301 can be formed of SiO through CVD using $SiH_4$ (silane) and $N_2O$ (dinitrogen monoxide). The block layer 302 can be formed of oxide semiconductor (OS) having low oxygen concentration or SiN. The film thickness of the block layer 302 is, for example, about 10 nm to 30 nm.

Figure 18:
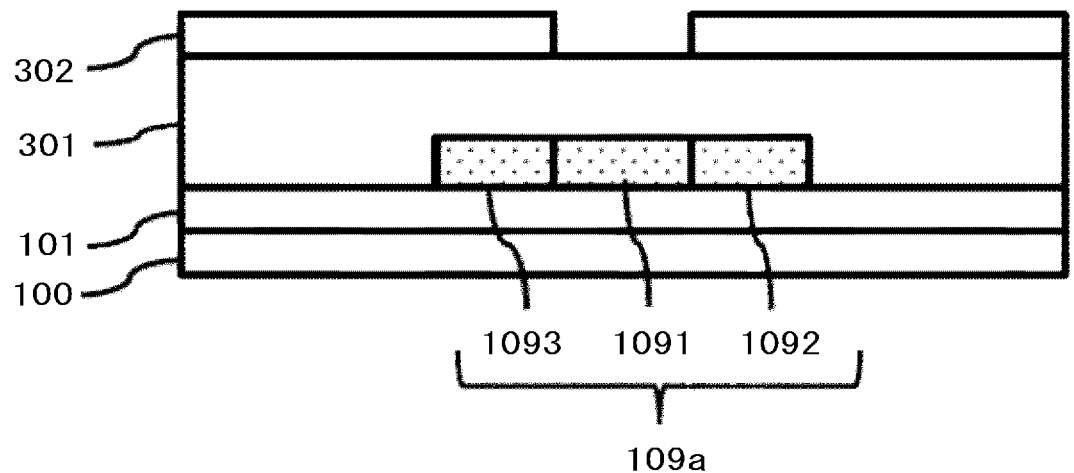
FIG. 18 is a cross-sectional view showing a state in which the block layer is patterned.

FIG. 18 is a cross-sectional view showing a state in which the block layer 302 is selectively patterned. The block layer 302 is selectively patterned so as to have an opening that covers a portion of the gate insulating film 301 located on the channel region (1091) of the semiconductor layer 109a in a cross-sectional view and in a plane view.

Figure 19:
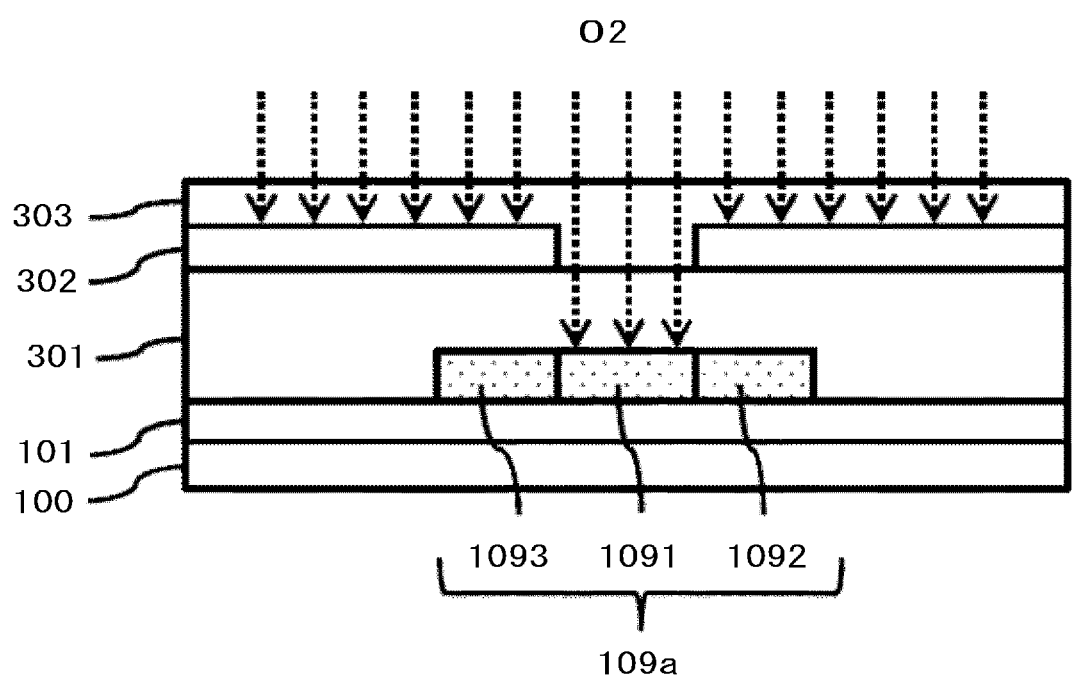
FIG. 19 is a cross-sectional view showing a state in which an aluminum oxide film is formed.

FIG. 19 is a cross-sectional view showing a state in which an AlO film 303 is formed on the block layer 302 and on a portion of the gate insulating film 301 that is exposed from the opening of the block layer 302. As is the case with the descriptions in the embodiment, because the AlO film 303 is formed through reactive spattering, the AlO film 303 includes a large amount of oxygen. This oxygen stabilizes the insulating resistance of the channel region 1091 of the semiconductor layer 109a. To put it concretely, although oxygen $O_2$ included in the AlO film 303 at the time of the AlO film 303 being formed is blocked by the block layer 302, a large amount of oxygen is introduced into the channel region 1091 of the semiconductor layer 109a over which there is no block layer 302, so that the channel region 1091 is excessively oxidized and has a high resistance. On the other hand, because the supply of oxygen to the drain region 1092 and the source region 1093 of the semiconductor layer 109a is blocked by the block layer 302, the drain region 1092 and the source region 1093 are not excessively oxidized, so that low resistances of the drain region 1092 and the source region 1093 can easily be kept unchanged. As described above, it is also possible that oxide semiconductor film including a large amount of oxygen is used instead of the AlO film 303. In other words, because the AlO film 303 works well as long as it is a means (a film or a layer) capable of supplying oxygen to the channel region of the semiconductor layer 109a, the AlO film or any of oxide semiconductor films including a large amount of oxygen can be used. Hereinafter the AlO film is used in the following descriptions as a representative of these films.

Figure 20:
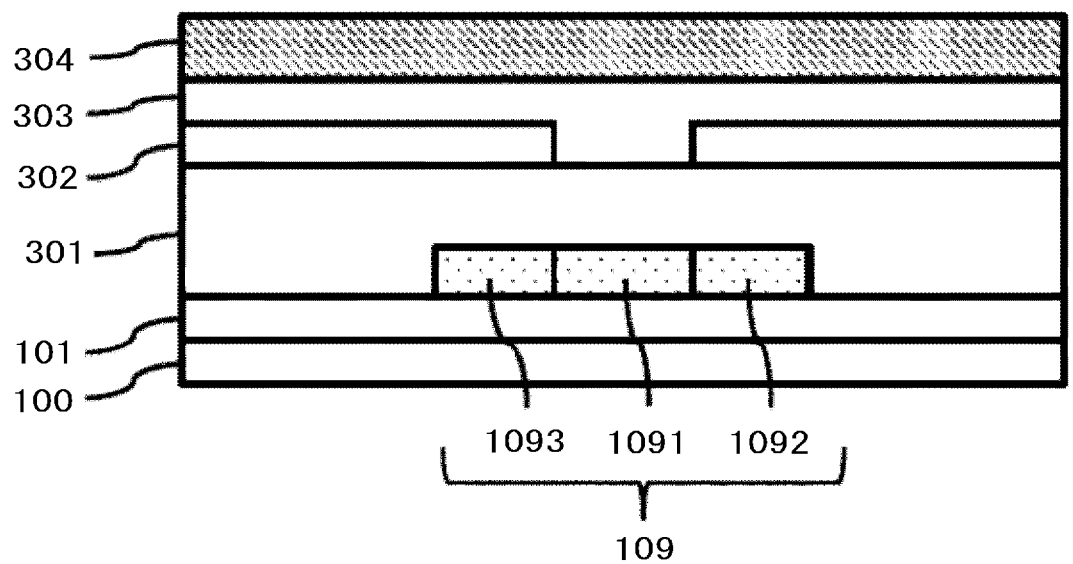
FIG. 20 is a cross-sectional view showing a state in which a gate electrode is formed.

FIG. 20 is a cross-sectional view showing a state in which a gate electrode 304 is formed on the AlO film 303. The gate electrode 304 is formed by a laminate film obtained by laminating Ti, an Al alloy, Ti, etc.; an MoW alloy; or the like.

FIG. 21 is a cross-sectional view showing a state in which block layers 302, the AlO film 303, and the gate electrode 304 are selectively patterned. The block layers 302, the AlO film 303, and the gate electrode 304 are selectively patterned so as to cover a portion of the gate insulating film 301 located on the channel region (1091) of the semiconductor layer 109a. The AlO film 303 is selectively formed on the downside of the gate electrode 304. The AlO film 303 and the gate electrode 304 are formed in an island shape when the entirety of the semiconductor device 10a is viewed in a plane view. In FIG. 21, ion plantation is executed using the gate electrode 304 as a mask, so that electrical conductivity is given to portions of the semiconductor layer 109a that are not covered by the gate electrode 304. As ions used in the ion implantation, B (boron) ions, P (phosphor) ions, Ar (argon) ions, or the like are used. Through the ion implantation, the drain region 1092 and the source region 1093 having electrical conductivity are formed in the semiconductor layer 109a. Subsequently, activation processing is executed in a hydrogen atmosphere, and the drain region 1092 and the source region 1093 are made to have low resistances. Therefore, a thin film transistor that is made using oxide semiconductor (OS) and has stable characteristics can be materialized.

FIG. 22 is a cross-sectional view showing a state in which, after a first insulating film 305 is formed so as to cover the gate insulating film 301, and the selectively patterned block layers 302, AlO film 303, and gate electrode 304, a second insulating film 306 is formed on the first insulating film 305. The first insulating film 305 is formed of SiN through CVD. The second insulating film 306 is formed of SiO through CVD.

FIG. 23 is a cross-sectional view showing a state in which source/drain electrode wirings 308 are formed in contact holes 307 respectively. The contact holes 307 are formed by dry etching using, for example, CF-based (e.g. $CF_4$) gas or CHF-based (e.g. $CHF_3$) gas. The contact holes 307 are formed penetrating through a three-layered insulating film (composed of the insulating films 306, 305, and 301) so that the drain region 1092 and the source region 1093 are exposed. Subsequently, the source/drain electrode wirings 308 are formed in the contact holes 307 respectively. In the abovementioned way, the semiconductor device 10a according to the modification example, which includes the thin film transistor TFT2 (OS TFT) using oxide semiconductor (OS), is formed.

By configuring the OS TFT as described above, the total length of the manufacturing processes can be shortened.

In addition, as is the case with the descriptions in the embodiment, sufficient oxygen is supplied to the channel region 1091 of the semiconductor layer 109a from the AlO film 303, so that the resistance of the channel region 1091 is made high. On the other hand, because the block layer 302 is formed over the drain region 1092 and the source region 1093 of the semiconductor layer 109a as shown in FIG. 18 and FIG. 19, oxygen from the AlO film 303 is blocked, so that the resistances of the drain region 1092 and the source region 1093 are made low. Therefore, it becomes possible to make the OS TFT have favorable transistor characteristics. Furthermore, the semiconductor device 10a such as a display device including OS TFTs having favorable transistor characteristics can be materialized.

In addition, because both edges of the channel region 1091 are made to have high resistances by leaving behind portions of the block layer 302 at both edges of the AlO film 303, that is to say, at portions of the AlO film 303 located above both edges of the channel region 1091, a current through the OS TFT does not flow smoothly, so that the OS TFT with a favorable switching characteristic can be materialized.

It is conceivable that all semiconductor devices that can be implemented by those skilled in the art through appropriate design modifications on the basis of the above-described semiconductor device according to the embodiment of the present invention fall within the scope of the present invention as long as these semiconductor devices include the gist of the present invention.

It should be understood that, if various alternation examples and modification examples are easily conceived by those skilled in the art within the idea of the present invention, those alternation examples and modification examples also fall within the scope of the present invention. For example, devices obtained in the case where those skilled in the art appropriately add components to the above-described embodiment, delete components from the above-described embodiment, perform design changes to the above-described embodiment, add processes to original processes for the above-described embodiment, omit processes from the original processes, or alter conditions for implementing the above-described embodiment fall within the scope of the present invention as long as the devices do not deviate from the gist of the present invention.

In addition, as for other operational effects brought about by the present embodiment, it should be obviously understood that some of the other operational effects, which are clear from the descriptions of the present specification and can be accordingly conceived by those skilled in the art, are brought about by the present invention.

Various inventions can be achieved by appropriately combining plural components disclosed in the above-described embodiment. For example, a new invention will be achieved by deleting some components from all the components included in the embodiment. Alternatively, another new invention will be achieved by appropriately combining components from the above-described embodiment and modification example.

What is claimed is:

1. A method of manufacturing a semiconductor device including a thin film transistor having a semiconductor layer of oxide semiconductor with a channel region, a drain region, and a source region, the method comprising:

forming the semiconductor layer on a substrate;

forming a gate insulating film so that the gate insulating film covers the semiconductor layer;

forming a block layer including an opening over the channel region of the semiconductor layer on the gate insulating film;

forming an aluminum oxide film on the block layer and on a portion of the gate insulating film exposed from the opening and supplying oxygen through the opening to the channel region of the semiconductor layer;

forming a gate electrode on the aluminum oxide film; and selectively patterning the gate electrode, the aluminum oxide film, and the block layer so that an upper part of the channel region of the semiconductor layer is covered, wherein the patterning is executed such that portions of the block layer are left behind at both edges of the aluminum oxide film.

2. The method of manufacturing a semiconductor device according to claim 1 further comprising:

giving electrical conductivity to the drain region and the source region of the semiconductor layer through an ion implantation using the selectively patterned gate electrode as a mask;

forming an insulating film so as to cover the selectively patterned gate electrode, aluminum oxide film, and block layers;

forming contact holes in the insulating film and the gate insulating film so that the drain region and the source region are exposed; and forming wirings in the contact holes.

* * * * *